(12) United States Patent
Collins (10) Patent No.: US 6,600,211 B1
(45) Date of Patent: Jul. 29, 2003

(54) BIPOLAR TRANSISTOR CONSTRUCTIONS

(75) Inventor: Nathaniel J. Collins, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/175,175

(22) Filed: Jun. 18, 2002

Related U.S. Application Data (62) Division of application No. 10/094,166, filed on Mar. 8, 2002, now Pat. No. 6,524,921.

(51) Int. Cl.[7] .............................................. H01L 27/082
(52) U.S. Cl. ...................... 257/565; 257/571; 257/586
(58) Field of Search ................................ 257/565, 571, 257/579, 575, 576, 583, 591, 592, 586

(56) References Cited

U.S. PATENT DOCUMENTS

| | | |
|---|---|---|
| 4,007,474 A | 2/1977 | Yagi et al. |
| 5,504,018 A | 4/1996 | Sato |
| 6,114,746 A * | 9/2000 | Leonardi et al. ............ 257/592 |
| 2002/0079554 A1 * | 6/2002 | Okawa et al. .............. 257/565 |
| 2002/0135046 A1 * | 9/2002 | Yu ............................. 257/579 |

OTHER PUBLICATIONS

Silicon Processing for the VLSI Era—vol. II; pp. 482–483.
"ESD Protection Scheme using CMOS Compatible Vertical Bipolar Transsitor for 130 nm CMOS generation"; Mototsugu Okushima et al; IEEE; Apr. 2000; pp. IEDM 00–127–00130.

* cited by examiner

Primary Examiner—Tuan H. Nguyen
(74) Attorney, Agent, or Firm—Wells St. John P.S.

(57) ABSTRACT

The invention includes a bipolar transistor construction having a collector region, emitter region, and base region extending within a semiconductive material substrate. The construction further comprises separate access regions associated with the base region, emitter region and collector region, respectively. An n-type doped connecting region is comprised by the collector region and extends beneath the emitter and base regions. A p-type doped location is comprised by the base region and extends beneath the emitter region and above the n-type doped connecting region. An n-type doped intermediate location is within the emitter region and between the p-type doped location and the emitter access region. The invention also includes methods of forming bipolar transistors.

16 Claims, 5 Drawing Sheets

BIPOLAR TRANSISTOR CONSTRUCTIONS

RELATED PATENT DATA

This application resulted from a divisional of application Ser. No. 10/094,166, which was filed on Mar. 8, 2002, now U.S. Pat. No. 6,524,921 and which is incorporated by reference herein.

TECHNICAL FIELD

The invention pertains to bipolar transistor constructions, and to methods of forming bipolar transistor constructions.

BACKGROUND OF THE INVENTION

Bipolar transistor constructions can have numerous applications in modern semiconductor devices. For instance, bipolar transistors can be incorporated into electrostatic discharge (ESD) protection schemes for complementary metal oxide semiconductor (CMOS) assemblies. An exemplary CMOS assembly is described with reference to FIG. 1, which illustrates a fragment of a semiconductor wafer 10.

Figure 1:
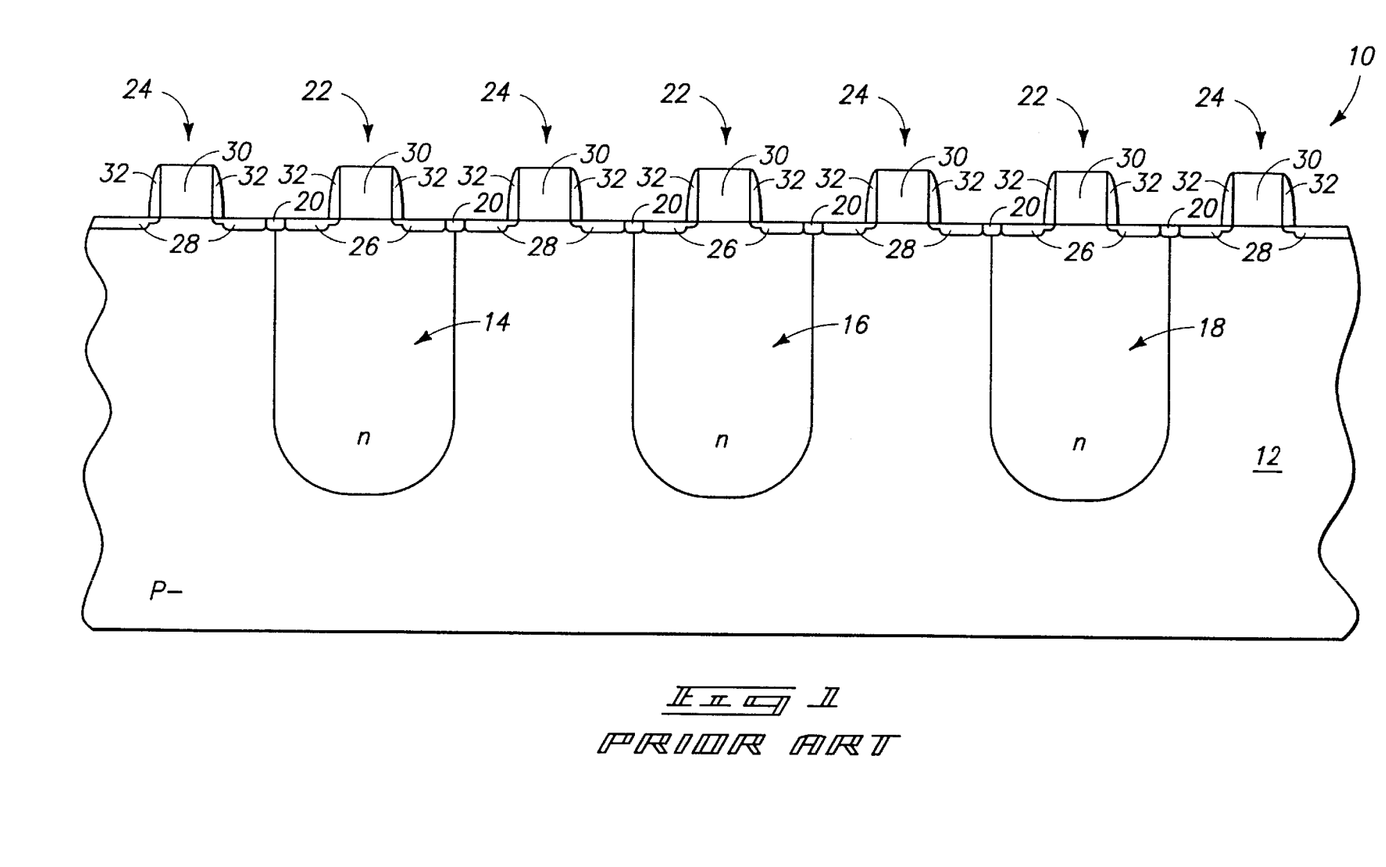
FIG. 1 is a diagrammatic, cross-sectional view of a semiconductor wafer fragment illustrating a prior art CMOS construction.

Wafer 10 comprises a substrate 12. Substrate 12 can comprise, consist essentially of, or consist of monocrystalline silicon lightly doped with a background p-type dopant (so-called p-minus, or p-, doping). To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An exemplary background p-type dopant concentration within substrate 12 is less than $1\times10^{16}$ atoms/cm$^3$; such as, for example, from about $1\times10^{14}$ atoms/cm$^3$ to about $1\times10^{16}$ atoms/cm$^3$. A suitable p-type dopant is boron.

A plurality of n-wells 14, 16 and 18 are formed within substrate 12 by implanting a suitable n-type dopant (such as, for example, phosphorous or arsenic) into substrate 12. The concentration of n-type dopant within n-wells 14, 16 and 18 is preferably at least 10-fold higher than the background concentration of p-type dopant within substrate 12, and accordingly overwhelms the p-type dopant within regions 14, 16 and 18. A suitable concentration of n-type dopant is from about $1\times10^{15}$ atoms/cm$^3$ to about $1\times10^{18}$ atoms/cm$^3$.

A plurality of isolation regions 20 are formed across an upper surface of substrate 12. Isolation regions 20 can comprise, for example, shallow trench isolation regions filled with an appropriate insulative material, such as silicon dioxide.

A plurality of p-type metal oxide semiconductor (PMOS) transistor structures 22 are formed to be supported by substrate 12, and to be associated with n-well regions 14, 16 and 18. Also, a plurality of n-type metal oxide semiconductor (NMOS) transistor constructions 24 are formed to extend across substrate 12 and to be associated with p-type regions between the n-wells. PMOS transistors 22 comprise source/drain regions 26 which are doped with an appropriate p-type dopant, and NMOS transistors 24 comprise source/drain regions 28 which are doped with an appropriate n-type dopant. NMOS transistors 22 and PMOS transistors 24 comprise transistor gate structures 30 and sidewall spacers 32 along the transistor gates. Transistor gates 30 can comprise, for example, a layer of gate oxide and overlying layers of conductive materials (such as, for example, one or more of conductively-doped silicon, metal and metal silicide). Sidewalls 32 can comprise, for example, silicon nitride or silicon dioxide. The transistor gates associated with NMOS constructions 24 can be different than those associated with PMOS constructions 22. For instance, the gates associated with the NMOS constructions can comprise n-type conductively doped polycrystalline silicon, while the gates associated with the PMOS constructions can comprise p-type conductively doped polycrystalline silicon.

It would be desirable to develop bipolar transistor constructions which can be readily incorporated into CMOS assemblies of the type described with reference to FIG. 1.

SUMMARY OF THE INVENTION

In one aspect, the invention encompasses a bipolar transistor construction having a collector region, emitter region, and base region extending within a semiconductive material substrate. The construction further comprises separate access regions associated with the base region, emitter region and collector region, respectively. An n-type doped connecting region is comprised by the collector region and extends beneath the emitter and base regions. A p-type doped location is comprised by the base region and extends beneath the emitter region and above the n-type doped connecting region. An n-type doped intermediate location is within the emitter region and between the p-type doped location and the emitter access region.

In other aspects, the invention encompasses methods of forming bipolar transistor constructions.

BRIEF DESCRIPTION OF THE DRAWINGS

Preferred embodiments of the invention are described below with reference to the following accompanying drawings.

FIG. 4 is a view of the FIG. 2 wafer fragment shown at a processing step subsequent to that of FIG. 3.

DETAILED DESCRIPTION OF THE PREFERRED EMBODIMENTS

The invention encompasses bipolar transistor structures, and methods of forming bipolar transistor structures. An exemplary method encompassed by the present invention is described with reference to FIGS. 2–5.

Figure 2:
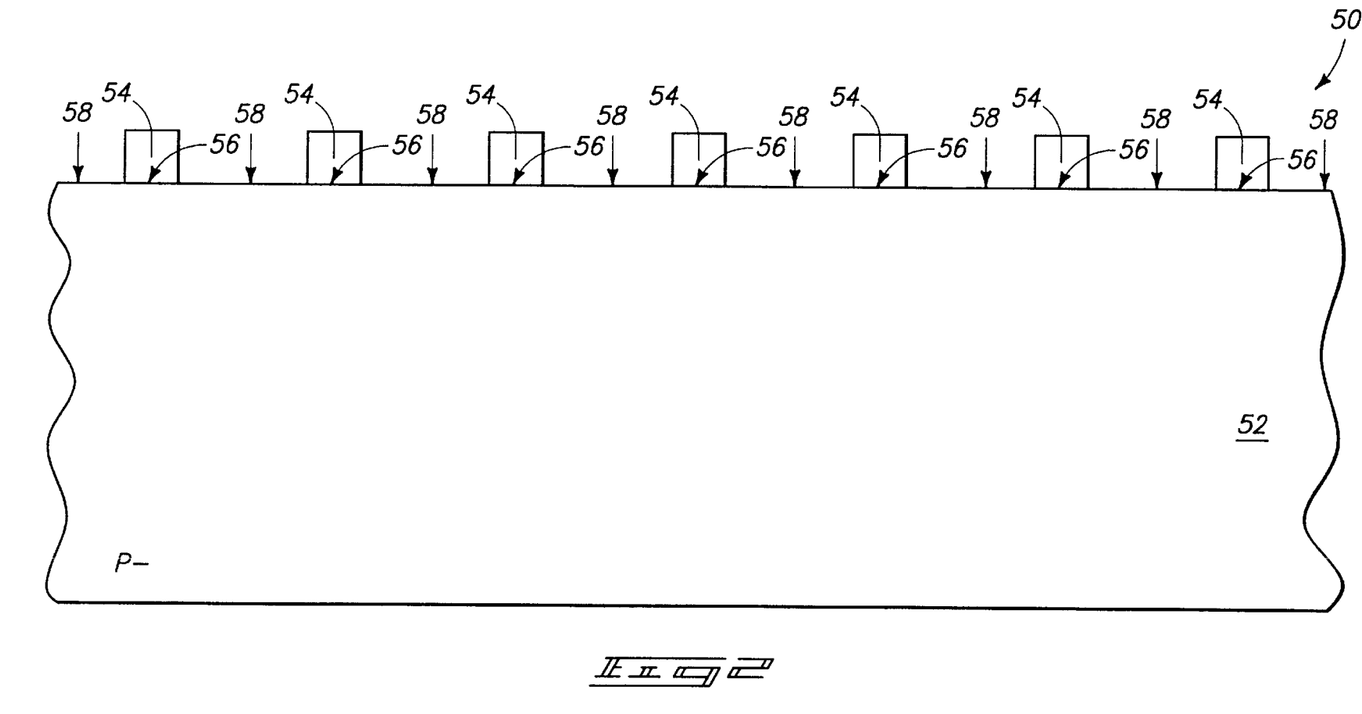
FIG. 2 is a diagrammatic, cross-sectional view of a semiconductor wafer fragment at a preliminary processing step in accordance with a method of the present invention.

Referring initially to FIG. 2, a fragment of an assembly 50 is illustrated at a preliminary processing step of a method of the present invention. Assembly 50 comprises a substrate 52. Substrate 52 typically comprises a semiconductive material, such as, for example, monocrystalline silicon. In the shown embodiment, substrate 52 comprises a semiconductive material lightly doped with a background p-type dopant, with the dopant indicated by the symbol "p-". Substrate 52 can be identical to the substrate 12 described previously with reference to FIG. 1. A patterned masking layer 54 is shown over substrate 52. Masking layer 54 can comprise, for example, photoresist, and can be patterned utilizing photolithographic processing. Patterned masking material 54 covers first regions 56 of substrate 52 and leaves second regions 58 uncovered.

Figure 3:
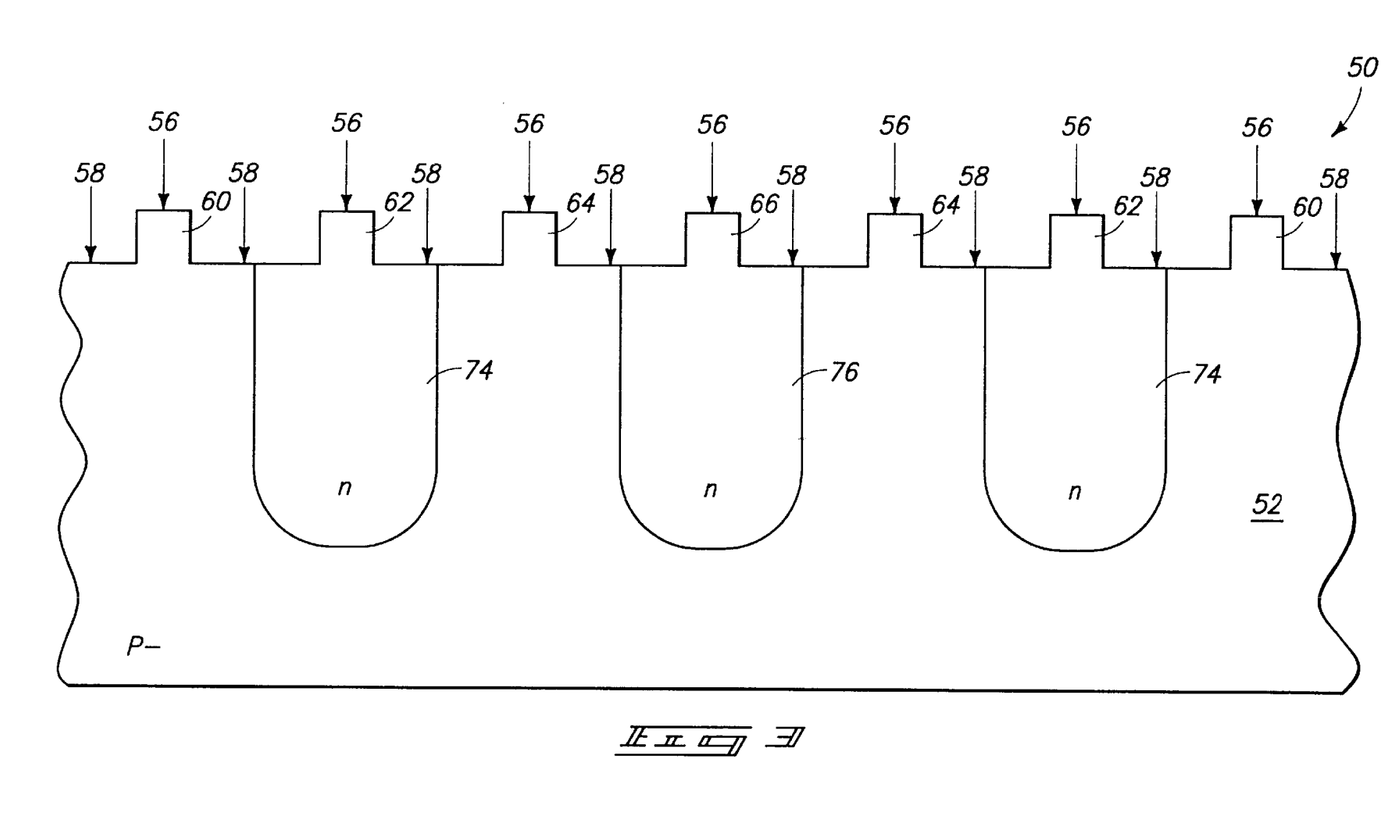
FIG. 3 is a view of the FIG. 2 wafer fragment shown at a processing step subsequent to that of FIG. 2.

While patterned masking material 54 is over substrate 52, uncovered regions 58 are exposed to etching conditions which etch into the uncovered regions. FIG. 3 illustrates assembly 50 after etching into uncovered regions 58 and subsequent removal of patterned masking material 54 (FIG. 2). Suitable etching conditions can comprise, for example, exposure of a monocrystalline substrate 52 to one or more of $CF_4$, $O_2$, $CF_3Cl$, $Cl_2$, and $SF_6$. The etching of regions 58 leaves projections 60, 62, 64 and 66 within regions 56.

N-wells 74 and 76 are formed within substrate 52, and in the shown embodiment are associated with projections 62 and 66, respectively. N-wells 74 and 76 can be formed by protecting regions of substrate 52 with a masking material (not shown) and leaving openings through the masking material in locations where n-wells 74 and 76 are ultimately to be formed. Subsequently, a suitable n-type dopant can be introduced by, for example, implantation into substrate 52 to form the n-wells, with an exemplary dopant being arsenic. The concentration of n-type dopant with wells 74 and 76 is preferably at least 10-fold greater than the background p-type dopant concentration in substrate 52 so that the n-type dopant overwhelms the p-type background doping to form the illustrated n-type doped regions (with the n-type doping indicated by the symbol "n"). A suitable n-type dopant concentration within wells 74 and 76 is from about $1\times10^{15}$ atoms/cm$^3$ to about $1\times10^{18}$ atoms/cm$^3$. After the implant of n-type dopant into wells 74 and 76, the patterned masking material utilized to define wells 74 and 76 can be removed to leave the structure 50 illustrated in FIG. 3.

It is noted that the implant of n-type dopant to form wells 74 and 76 can occur after patterning to define projections 60, 62, 64 and 66; or can occur prior to such patterning. For instance, wells 74 and 76 can be defined prior to the processing step illustrated in FIG. 2 in particular embodiments of the invention (not shown).

Referring to FIG. 4, a series of additional implants are conducted to define a bipolar transistor construction 100 comprising an emitter region 102, collector region 104, and base region 106. The construction 50 of FIG. 4 is illustrated in a top view in FIG. 5 to assist in the visualization of the various regions of bipolar transistor 100.

The implants conducted to form bipolar transistor 100 include an implant of an n-type doped material to form an n-type doped connecting region (or tie region) 110 extending as part of the collector region. The n-type doped connecting region 110 can be doped to a concentration of, for example, from about $1-10^{15}$ atoms/cm$^3$ to about $1\times10^{18}$ atoms/cm$^3$ with a suitable n-type dopant (for example, phosphorus and/or arsenic). The n-type dopant concentration within region 110 is preferably at least 10-fold higher than the p-type background doping of substrate 52, and accordingly overwhelms such background doping. The n-type dopant concentration with region 110 can be the same as, or comparable to, the dopant concentration within n-well regions 74 and 76.

In the shown embodiment, n-type doped connecting region 110 extends entirely across and below the emitter region 102, entirely across and below base region 106, and partially through collector region 104. It is to be understood that connecting region 110 can also extend entirely through collector region 104.

Connecting region 110 comprises a lowestmost edge 112, an uppermost edge 114, and a thickness between the lowermost and uppermost edges. The thickness of n-type doped region 110 can be, for example, from about 1000 angstroms to about 20,000 angstroms within emitter region 102.

A second implant utilized in forming bipolar transistor structure 100 is an implant of p-type dopant into substrate 52 to form p-type doped location 130, which is part of the base of bipolar transistor 100. A suitable p-type dopant is boron. The dopant concentration within p-type doped location 130 is preferably from about $1\times10^{16}$ atoms/cm$^3$ to about $1\times10^{18}$ atoms/cm$^3$. Additionally, the p-type dopant concentration within p-type doped location 130 is preferably at least 10-fold higher than the concentration of n-type dopant within wells 74 and 76 to overwhelm the n-type dopant.

The p-type doped location 130 has a lowermost edge 132 which, in the shown embodiment, is the same as the uppermost boundary 114 of region 110. P-type doped location 130 also has an uppermost boundary 128, and a thickness between boundaries 132 and 128. Such thickness can be for example, from about 1000 angstroms to about 15,000 angstroms, and can preferably be about 6000 angstroms. Although the shown p-type doped location 130 has a lowermost boundary that is identical to the uppermost boundary of n-type doped region 110, it is to be understood that the invention can encompass other embodiments (not shown) wherein regions 130 and 110 do not share a common boundary. Preferably, however, regions 130 and 110 are formed such that the lowermost boundary of region 130 is at about the same depth as the uppermost boundary of n-type doped region 110, with the term "about the same depth" indicating that the boundaries are within 50 angstroms of one another.

The p-type doped location 130, like n-type doped connecting region 110, extends entirely across and below emitter region 102.

The p-type doped location 130 and n-type doped connecting region 110 can be formed by initially providing a patterned mask (not shown) over substrate 52 which covers portions of substrate 52 while leaving an opening into which dopants are implanted to form regions 110 and 130. After formation of the regions 110 and 130, the mask can be removed.

In the shown exemplary application of the invention, emitter region 102 can be considered to include n-well 76 and projection 66; collector region 104 can be considered to include n-well 74, connecting region 110, and projection 62; and base region 106 can be considered to include projection 64, a p-type doped region 130, and regions 120 extending between wells 74 and 76.

The next implants utilized in forming the bipolar construction 100 of FIG. 4 are n-type dopant implants in projections 62 and 66 (illustrated as n+ implants), and p-type dopant implants in projection 64 (illustrated as p+ implants). The p-type dopant implants are also shown in projection 60, but such is not particularly germane to the formation of bipolar construction 100. The implants within the projections are heavy implants, and accordingly form a dopant concentrate of at least about $1\times10^{17}$ atoms/cm$^3$. The implant into projection 62 forms a collector access region 152 which can enable access to collector region 104; the implant into projection 66 forms an emitter access region 154 which can be utilized for electrically accessing emitter region 102; and the implant into region 64 forms a base access region 150 which can be utilized for electrically accessing base region 106.

The implants within projections 60, 62, 64 and 66 are indicated to have bottommost boundaries at dashed lines shown at bases of projections 60, 62, 64 and 66. The implants into projections 62 and 66 will form conductively doped regions having a higher concentration of dopant than do n-wells 74 and 76, and the implant into projection 64 forms base access region 150 to have a heavier dopant concentration than does the p-region 120 joined to the base access region.

The implants into projections 60, 62, 64 and 66 can be conducted with a pair of masks (not shown). Specifically, a first mask can be provided over all portions of substrate 52 except for the regions which are ultimately to be heavily doped with n-type dopant, which are only regions 62 and 66 of the fragment shown in FIG. 4. An n-type dopant can then be implanted into the exposed regions (regions 62 and 66 of the shown fragment 4) to form the heavily n-type doped regions. In such embodiment, the emitter and collector access regions are conductively doped in a common processing step, and would comprise the same n-type dopant (for example, arsenic). In subsequent processing, the mask which left regions 62 and 66 exposed is removed, and another mask is provided which covers all portions of substrate 52 except for the regions which are to be heavily doped with p-type dopant (only regions 60 and 64 of the shown fragment in FIG. 4). A p-type dopant is then implanted into regions 60 and 64 to form the heavily-doped regions, and subsequently the mask which had left regions 60 and 64 exposed is removed to leave the structure 50 shown in FIG. 4.

After formation of emitter access region 154 within projection 66, emitter 102 can be considered to comprise a heavily n-type doped access region, and a less heavily doped n-type intermediate region extending between the heavily n-type doped access region and p-type doped location 130. In a preferred embodiment, the upper surface 128 of p-type doped location 130 is at least about 9,000 angstroms beneath a lowermost boundary of the emitter access region (the conductively doped portion of projection 66), and can be at least 15,000 angstroms beneath a lowermost boundary of the emitter access region associated with projection 66. The uppermost boundary 114 of n-type doped region 110 is at least about 10,000 angstroms beneath the lowermost boundary of the emitter access region 154, and more preferably at least about 15,000 angstroms beneath such lowermost boundary. In preferred embodiments the intermediate n-type doped region between emitter access region 154 and p-type doped region 130 (i.e., the portion of the n-well 76 between emitter access region 154 and p-type doped region 130) has a dopant concentration of from about $1 \times 10^{15}$ atoms/cm$^3$ to about $1 \times 10^{18}$ atoms/cm$^3$.

The described ordering of formation of the doped regions corresponding to wells 74 and 76, base access region 64, collector access region 62, emitter access region 66, p-type doped location 130 and n-type doped connecting region 110 is but one embodiment of the present invention, and the ordering of the formation of the various implants can be altered in various other embodiments of the present invention. For instance, projections 60, 62, 64 and 66 can be formed by first providing conductivity-enhancing dopant within an upper portion of substrate 52 at the processing step of FIG. 2, and subsequently removing the illustrated second portions 58 to leave conductively-doped projections 60, 62, 64 and 66. The p-type doped location 130 can be formed before or after formation of n-type doped connecting region 110, as well as before or after formation of n-wells 74 and 76. Further, n-type doped connecting region 110 can be formed before or after formation of n-wells 74 and 76. Additionally, the implanting utilized to form base access region 150, collector access region 152 and emitter access region 154 can occur before or after formation of n-type collecting region 110 and p-type location 130.

Figure 5:
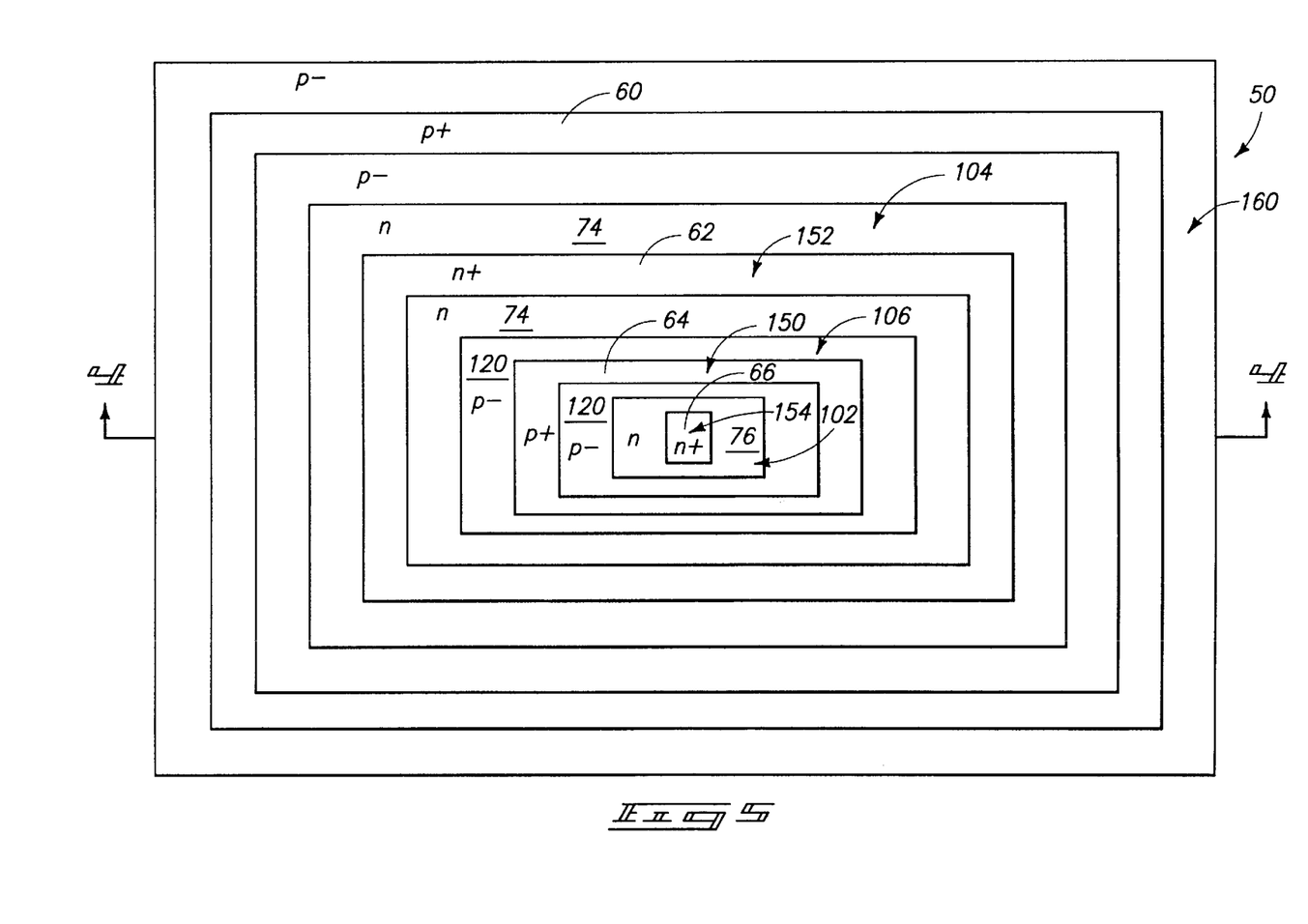
FIG. 5 is a top view of a portion of a semiconductor wafer shown at the processing step of FIG. 4.

FIG. 5 illustrates a top view of a preferred construction of the present invention wherein substrate 52 has an upper surface 160 between projections 60, 62, 64 and 66, and wherein emitter access region 154, base access region 150 and collector access region 152 are considered to be on such upper surface. Base access region 150 is shown to comprise a rectangular construction which entirely surrounds a lateral periphery of emitter access region 154, and collector access region 152 is shown to comprise a rectangular shape which entirely surrounds a lateral periphery of base access region 150. The referred to "lateral periphery" is a side periphery of the access regions relative to the orientation of the regions in FIG. 4.

The methodology of the present invention has advantageously utilized the CMOS substrate of FIG. 1 in formation of a bipolar transistor structure. Such structure can be integrated with CMOS structures for control of static electrical discharge.

Among the advantages of the bipolar transistor of the present invention is that such can carry a first desired voltage, break down at a second desired voltage, and yet have a relatively narrow base width. For example, a bipolar transistor of the present invention can break down at a voltage of from about 5 volts to about 20 volts and carry a desired voltage of from about 2 volts to about 20 volts. Further, the bipolar transistor of the present invention can have a base width of, for example, from about 3000 angstroms to about 10,000 angstroms, with a preferred base width being about 5000 angstroms.

Another advantage of the present invention is that such can have a p-well (the p-layer 120 associated with the base region 106) which is completely surrounded by n-type doped materials, which means that such p-layer is completely electrically isolated from other p-type materials. Such can improve operating characteristics of the device of the present invention relative to previous bipolar devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A bipolar transistor, comprising:
   a semiconductive material substrate;
   a collector region, emitter region and base region extending within the semiconductive material substrate;
   separate access regions associated with the base region, emitter region and collector region, respectively; the base access region being a p-type region, and the emitter and collector access regions being n-type regions;
   the collector region including an n-type doped connecting region extending beneath the emitter and base regions;
   the base region including a p-type doped location extending beneath the emitter region and above the n-type doped connecting region;

an n-type doped intermediate location within the emitter region and between the p-type doped location and the emitter access region; the n-type doped intermediate location being less heavily doped with n-type dopant than the emitter access region; and wherein the base access region, emitter access region and collector access region comprise conductively doped projections extending upwardly from the semiconductive material substrate.

2. The bipolar transistor of claim 1 wherein the semiconductive material substrate comprises monocrystalline silicon; and wherein base access region, emitter access region and collector access region comprise conductively doped monocrystalline silicon projections extending upwardly from the semiconductive material substrate.

3. The bipolar transistor of claim 1 wherein:

the semiconductive material substrate comprises monocrystalline silicon doped with a p-type dopant;

the collector and emitter regions comprise n-type doped wells within the substrate; and the base region comprises a region of the substrate between the n-type doped well corresponding to the collector region and the n-type doped well corresponding to the emitter region.

4. The bipolar transistor of claim 1 wherein the emitter and collector access regions are conductively-doped with the same n-type dopant.

5. The bipolar transistor of claim 1 wherein the n-type doped connecting location has an uppermost boundary which is at least about 10,000 Å beneath a lowermost boundary of the emitter access region.

6. The bipolar transistor of claim 1 wherein:

the n-type doped connecting location has an uppermost boundary which is at least about 10,000 Å beneath a lowermost boundary of the emitter access region; and the p-type doped location has a lowermost boundary at about a same depth as the uppermost boundary of the n-type doped connecting location, and a thickness of from about 1,000 Å to about 15,000 Å.

7. The bipolar transistor of claim 1 wherein the n-type doped connecting location has an uppermost boundary which is at least about 10,000 Å beneath a lowermost boundary of the emitter access region, and wherein the n-type doped connecting location has a thickness of from about 1,000 Å to about 20,000 Å within the emitter region.

8. The bipolar transistor of claim 1 wherein the emitter access region has an n-type dopant concentration of greater than $1 \times 10^{17}$ atoms/cm$^3$; and the n-type doped intermediate location has an n-type dopant concentration of from about $1 \times 10^{15}$ atoms/cm$^3$ to about $1 \times 10^{18}$ atoms/cm$^3$.

9. The bipolar transistor of claim 1 wherein the p-type doped location is less heavily doped with p-type dopant than the base access region.

10. The bipolar transistor of claim 9 wherein the base access region has a p-type dopant concentration of greater than $1 \times 10^{17}$ atoms/cm$^3$; and the p-type doped location has a p-type dopant concentration of from about $1 \times 10^{16}$ atoms/cm$^3$ to about $1 \times 10^{18}$ atoms/cm$^3$.

11. The bipolar transistor of claim 1 wherein:

the base access region-entirely surrounds a lateral periphery of the emitter access region; and the collector access region entirely surrounds a lateral periphery of the base access region.

12. The bipolar transistor of claim 1 wherein:

the substrate has an upper surface;

the emitter access region, base access region and collector access region are each on the upper surface;

the base access region entirely surrounds a lateral periphery of the emitter access region; and the collector access region entirely surrounds a lateral periphery of the base access region.

13. A bipolar transistor, comprising:

a semiconductive material substrate;

a collector region, emitter region and base region extending within the semiconductive material substrate;

separate access regions associated with the base region, emitter region and collector region, respectively; the base access region being a p-type region, and the emitter and collector access regions being n-type regions;

the collector region including an n-type doped connecting region extending beneath the emitter and base regions;

the base region including a p-type doped location extending beneath the emitter region and above the n-type doped connecting region;

an n-type doped intermediate location within the emitter region and between the p-type doped location and the emitter access region; the n-type doped intermediate location being less heavily doped with n-type dopant than the emitter access region; and wherein the semiconductive material substrate comprises monocrystalline silicon; and wherein base access region, emitter access region and collector access region comprise conductively doped monocrystalline silicon projections extending upwardly from the semiconductive material substrate.

14. A bipolar transistor, comprising:

a semiconductive material substrate;

a collector region, emitter region and base region extending within the semiconductive material substrate;

separate access regions associated with the base region, emitter region and collector region, respectively; the base access region being a p-type region, and the emitter and collector access regions being n-type regions, at least one of the access regions extending outwardly from the semiconductive material substrate;

the collector region including an n-type doped connecting region extending beneath the emitter and base regions;

the base region including a p-type doped location extending beneath the emitter region and above the n-type doped connecting region; and an n-type doped intermediate location within the emitter region and between the p-type doped location and the emitter access region; the n-type doped intermediate location being less heavily doped with n-type dopant than the emitter access region.

15. The bipolar transistor of claim 14 wherein the semiconductive material substrate comprises monocrystalline silicon.

16. The bipolar transistor of claim 14 wherein the separate access regions comprise conductively doped monocrystalline silicon.

* * * * *

UNITED STATES PATENT AND TRADEMARK OFFICE
CERTIFICATE OF CORRECTION

PATENT NO. : 6,600,211 B1
DATED : July 29, 2003
INVENTOR(S) : Nathaniel J. Collins It is certified that error appears in the above-identified patent and that said Letters Patent is hereby corrected as shown below:

Column 3,
Line 21, please delete "76are" after "and" and insert -- 76 are --.
Line 53, please delete "$1-10^{15}$" after "about" and insert -- $1X10^{15}$ --.

Column 4,
Line 54, please insert -- ) -- after "implants".

Signed and Sealed this

Third Day of February, 2004

JON W. DUDAS
*Acting Director of the United States Patent and Trademark Office*